United States Patent
Toy et al.

(10) Patent No.: US 6,218,730 B1
(45) Date of Patent: Apr. 17, 2001

(54) APPARATUS FOR CONTROLLING THERMAL INTERFACE GAP DISTANCE

(75) Inventors: Hilton T. Toy, Wappingers Falls; Raed A. Sherif, Croton-on-Hudson, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/226,458

(22) Filed: Jan. 6, 1999

(51) Int. Cl.[7] ................................................. H01L 23/12
(52) U.S. Cl. ......................... 257/704; 257/707; 257/710; 257/713; 257/778; 361/709
(58) Field of Search ................................. 257/704, 706, 257/707, 710, 713, 778, 779, 717, 720, 712, 730; 438/122; 361/697, 709, 711

(56) References Cited

U.S. PATENT DOCUMENTS

| | | | |
|---|---|---|---|
| 5,200,365 | * 4/1993 | Culver | 438/122 |
| 5,276,586 | * 1/1994 | Hatsuda et al. | 361/387 |
| 5,311,402 | * 5/1994 | Kobayashi et al. | 361/760 |
| 5,329,160 | * 7/1994 | Miura et al. | 257/710 |
| 5,471,027 | 11/1995 | Call et al. | 219/95.13 |
| 5,585,671 | * 12/1996 | Nagesh et al. | 257/697 |
| 5,587,882 | * 12/1996 | Patel | 361/705 |
| 5,777,847 | 7/1998 | Tokuno et al. | 361/705 |
| 5,889,652 | * 3/1999 | Turturro | 361/705 |
| 5,956,576 | * 9/1999 | Toy et al. | 438/125 |
| 5,982,038 | * 12/1999 | Toy et al. | 257/772 |
| 6,008,536 | * 12/1999 | Mertol | 257/704 |
| 6,088,915 | * 7/2000 | Turturro | 29/840 |

FOREIGN PATENT DOCUMENTS

| | | |
|---|---|---|
| 0130279A2 | 3/1984 | (EP) . |
| 0350593A2 | 5/1989 | (EP) . |
| 58-68951 * | 4/1983 | (JP) . |
| 1-57738 * | 3/1989 | (JP) . |
| 1-161736 * | 6/1989 | (JP) . |
| 3-48446 * | 3/1991 | (JP) . |
| 4-240751 * | 8/1992 | (JP) . |
| 4-246847 * | 9/1992 | (JP) . |
| 5-114662 * | 5/1993 | (JP) . |
| 5-226487 * | 9/1993 | (JP) . |

* cited by examiner

Primary Examiner—D. Chaudhuri
Assistant Examiner—Alonzo Chambliss
(74) Attorney, Agent, or Firm—Lawrence D. Cutter; Jay H. Anderson

(57) ABSTRACT

Tolerances in chip, substrate and hardware dimensions are accommodated by means of a floating sealing structure to insure that compliant thermally conductive paste disposed between the chip and its lid is as trim as possible in order to reduce thermal resistance of the paste so as to be able to run the chip at a cooler temperature. Standoffs are also preferably employed to insure proper paste gap thickness.

10 Claims, 2 Drawing Sheets

APPARATUS FOR CONTROLLING THERMAL INTERFACE GAP DISTANCE

BACKGROUND OF THE INVENTION

The present invention is generally directed to structures and methods for controlling the thickness of the gap between an electronic circuit chip and a lid, heat sink or other cooling mechanism. More particularly, the present invention is directed to a system in which the size of the gap between the circuit chip and the lid or heat sink is controlled and even more particularly controlled so that this gap is made to be as small as possible without deleteriously effecting the assembly process or chip integrity. Even more particularly, the present invention is directed to a system for controlling the thickness of thermal paste material disposed between either a single chip or multi-chip module and its lid or cover.

As device integration levels keep on increasing, the demand for a more efficient solution to the cooling of high power electronic circuit chips becomes an even more important ingredient in achieving required system performance. The use of thermal paste or gel to cool single chip or multi-chip modules is highly desirable because of its simplicity and high thermal performance. Thermal pastes are also not impacted by small particle contamination; hence, module assembly can be done in non-clean room environments, which is a factor in helping to reduce module assembly costs. Furthermore, the compliance of thermal pastes allows them to absorb mechanical tolerances that are associated with chip height and hardware variations.

An additional method for providing efficient cooling for electronic circuit chips is the use of solder between the chip and its corresponding module lid. In such cases, the chip backside is metallized and solder is wetted to both lid and chip surfaces such that when the solder is reflowed, a joint is achieved between the chip and the lid. Solder has a thermal conductivity about ten times the thermal conductivity of the best thermal paste available; hence it provides a significant improvement in thermal performance over thermal pastes. However, the compliance advantages of thermal pastes can be achieved while simultaneously improving thermal conductive characteristics through control of paste thickness in the gap between chip and lid.

It is known that it is desirable for electronic devices to operate at low temperatures for enhanced performance and reliability. This is particularly true for CMOS devices where a 10° C. reduction in temperature produces approximately a 2% gain in system speed.

To a first order of approximation, the temperature of the chip is given by the following one-dimensional equation:

$$T_{chip} = T_{air} + P_{chip} \times R_{int} + P_{mod} \times R_{ext}$$

In the case of a single chip module, the module power equals the chip power, and the above equation simplifies to:

$$T_{chip} = T_{air} + P_{chip} \times (R_{in} + R_{ext})$$

In the above equations, $R_{in}$ represents the internal thermal resistance of the module, that is the resistance from the chip up through the thermal paste to the module lid, whereas $R_{ext}$ represents the thermal resistance external to the module, that is the lid-to-heat sink interface plus the heat sink resistance, including air heating effects.

The internal thermal resistance is composed of three resistances in series:

$$R_{in} = R_{chip} + R_{paste} + R_{lid}$$

Since the lid is typically made of a high thermal conductivity material such as aluminum, the thermal paste resistance is the largest contributor to the internal thermal resistance, $R_{in}$. Reduction of the thermal paste resistance is therefore a significant factor in reducing the overall device temperature.

The thermal resistance of paste is given by the following equation:

$$R_{paste} = L_{gap} / (K_{paste} \times A_{chip})$$

where $L_{gap}$ is thickness of the paste between the chip and module lid, $K_{paste}$ is the paste thermal conductivity, and $A_{chip}$ is the area of the chip. It is clear from this expression that reduction of the paste thermal resistances, $R_{paste}$, can only be accomplished via either (i) reduction of the paste gap size and/or (ii) an increase in the thermal conductivity of the thermal paste.

Current designs use the compliance of the thermal paste to accommodate variations in the thermal paste gap. The tolerances are mainly driven by the tolerances on the chip thickness, tolerances for the chip solder balls and by tolerances on the hardware ans substrate. The statistical variations of these tolerances are typically between ±0.003 to 0.004 inches. Since the thermal paste "squeeze force" goes up exponentially as the paste is squeezed into very small gaps, that is into gaps under 0.003 inches, any single chip or multi-chip module should be designed to achieve a thermal paste gap of at least 0.007 inches under normal conditions. The statistical maximum paste gap therefore becomes 0.010 to 0.011 inches.

If solder is used between the chip and the module lid, it is still necessary to consider the same type of design tolerances as with thermal paste alone. While paste gap control for solder is not as critical to thermal performance, the apparatus and method disclosed herein for controlling the thermal paste gap is also employable to achieve optimum solder fillet shape since this can have an impact on solder reliability during thermal cycling. Accordingly, via the present invention, thermal paste cooling becomes more efficient and the solder thermal interface becomes more reliable. (It is noted that it is the higher thermal conductivity of solder which tends to reduce design tolerance problems as compared with the use of thermal paste alone).

The present invention provides a structure and a method for controlling the gap between the chip and a module lid while still maintaining the chip and its interconnect structure within a sealed environment. The sealed package is desirable to prevent moisture from contacting the chip, particularly over long periods of time. Accordingly, the improved use of thermal paste cooling, as employed in the present invention becomes more efficient and even solder based cooling systems become even that much more reliable.

SUMMARY OF THE INVENTION

In a preferred embodiment of the present invention an electronic chip assembly is provided for controlling thermal paste thickness. In particular, a substrate having electrical conductors is provided together with an electronic circuit chip which is affixed face down to the substrate so as to make electrical contact between the circuit chip and electrical conductors on the substrate. A thermal paste is disposed on the non-face down side of the circuit chip. A substantially flat thermally conductive lid is disposed over the chip and in thermal contact with the paste. In one embodiment the lid possesses a greater horizontal extent than the chip and therefore has a lid portion which overhangs the chip. Furthermore from this overhanging lid portion there depends a male lid sealing ring around the periphery of the lid. Additionally there is provided a corresponding female channel on the substrate. This channel has sidewalls and there is sealant disposed within the channel so as to form a seal between the sidewalls of the channel and the downwardly depending male lid sealing ring.

In another embodiment of the present invention instead of employing a female channel on the substrate, a female channel is disposed in the thermally conductive lid and a corresponding male ceiling ring is disposed on the substrate. This male sealing ring possesses a T-shaped cross section with the vertical portion of the "T" extending into sealant which is disposed between the sealing ring and the sidewalls of the female channel receptacle in the lid portion.

In yet another embodiment of the present invention which also employs a female receiving channel in the lid, a T-shaped male sealing ring is employed. However, in this embodiment the male sealing ring having a T-shaped cross section is disposed along the outer periphery of the substrate with the normally vertical portion of the "T" being disposed in a horizontal position sealed to the substrate. The normally horizontal cross section of the "T" extends upwardly into sealant disposed between the male sealing ring and the lid. This embodiment is particularly advantageous in those situations in which it is desirable that the lid extend beyond the substrate. In such an embodiment the lid not only overhangs the chip, but also overhangs the substrate. This embodiment is particularly useful in situations in which greater thermal heat sinking and heat spreading capabilities are desired.

In yet another embodiment a female channel is provided in the lid and an intermediate male ring is first sealably affixed to the substrate and then subsequentially disposed within the female channel portion of the lid. As in appropriate embodiments above, sealant material in cured form is provided between a male portion and a female channel which is disposed within the lid. The sealant herein may be a curable polymer or solder, as appropriate.

In yet another embodiment of the present invention female channel portions and male sealing members are not employed. Instead the sides of the lid are made sufficiently short so that sealant material may be employed between the lid and the substrate.

As used herein and in the appended claims, reference is made to portions which are described as being either horizontal or vertical. It is noted however, that these terms are relative. It is not essential that these structures actually be oriented in the positions shown in the figures and in particular they may be inverted or disposed in directions rotated 90° from that shown or in fact rotated by any amount from that which is shown. It is also noted herein that circuit chips possess two sides. One face is the flat back side of the chip and the other side is the face up side from which electrical connections are made.

Accordingly, it is an object of the present invention to provide a method and apparatus for controlling the thickness of compliant thermally conductive material disposed between a chip and a lid in either a single chip or multichip module.

It is an object of the present invention to improve the flow of heat away from an integrate circuit chip device.

It is yet another object of the present invention to increase the operating speed of electronic circuit chip devices.

It is a still further object of the present invention to provide thermal advantages both for solder and thermal paste systems.

It is also an object of the present invention to reduce the statistical effects of variations in tolerance in assembled electronic circuit chip modules.

It is also an object of the present invention to reduce the gap between a thermally conductive lid and an electronic circuit chip which is encapsulated by the lid to a distance of less than approximately 2 to 3 mils.

Lastly, but not limited hereto, it is an object of the present invention to not only reduce but to also control the thickness of thermal paste materials disposed between electronic circuit chips and their containing packages.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
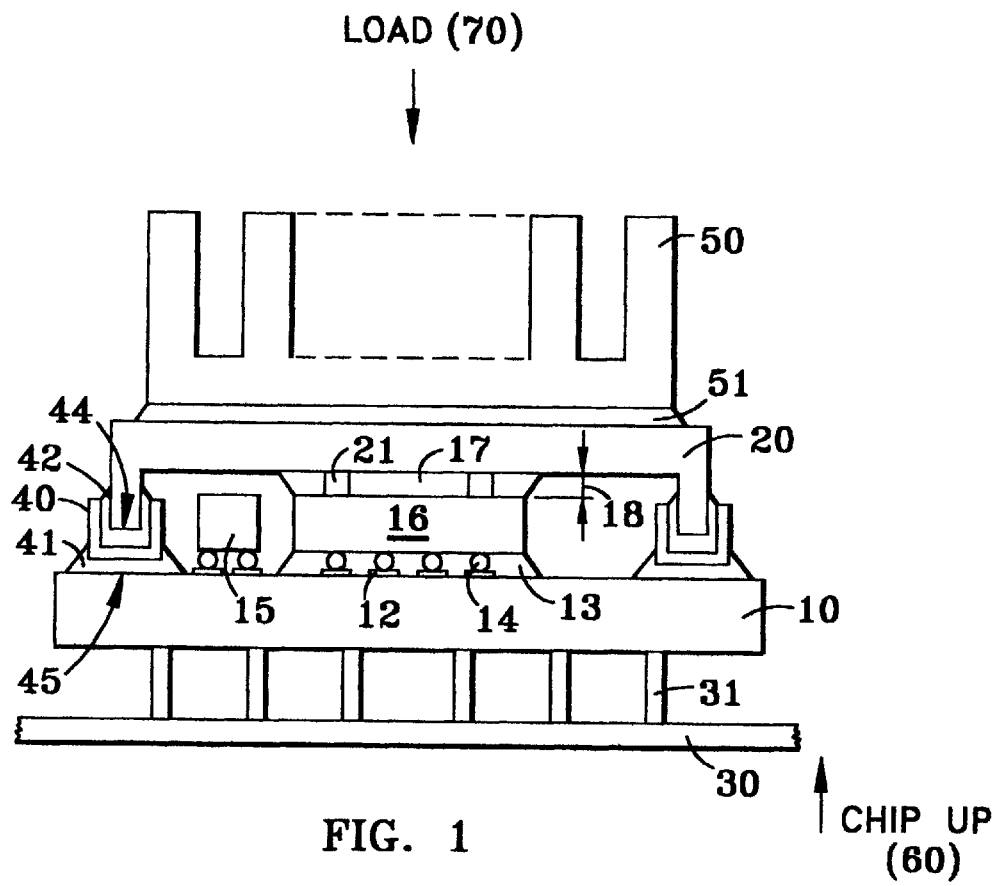
FIG. 1 is a side elevation view in accordance with one embodiment of the present invention which employs a separately provided U-shaped receiving channel.

The present invention enhances the thermal performance of electronic module packages which are designed for increasingly higher power levels as a result of increased device integration, speed and density. In particular the present invention provides a method and apparatus for reducing the thermal paste gap in a sealed electronic module or package. The advantage of this invention is that it improves module thermal performance by providing a shorter heat transfer path between the chip device and the module lid by using a direct thermal gap approach. The sealed module meets all product performance and reliability requirements.

The area between the lid and chip device surfaces is also preferably controlled in the present invention by means of mechanical standoffs with the result that the module is encapsulated with a variable height seal joint. There is a decrease in the level of "tolerance buildup" when the chip device and the lid surface are directly referenced by means of these mechanical standoffs. In module designs where variable height seal joints are not provided, the chip and the lid gap may have large statistical tolerances, for example, ±0.003 to 0.004 inches. However, using the direct gap approach herein the tolerance between the chip and the lid is reduced to approximately ±0.0005 inches. The nominal gap dimension is reduced to 0.003 to 0.004 inches from a previous level of 0.007 inches. This gap dimension and tolerance reduction translates to significant thermal improvement, especially for high powered chips. For example, if one considers a chip which is 12 mm on each side which dissipates 60 watts, then with a thermal paste conductivity of 3 watts per meter-Kelvin, current gap designs (at 0.010 inches) produce a 35° drop in temperature across the thermal paste interface, that is, the chip is 35° C. hotter than the lid. However, use of the structure provided in the present invention produces a maximum paste gap of approximately 0.004 inches which translates to a temperature drop of only 14° C. across the paste. That is, the chip temperature is reduced by over 20° C. That corresponds to an approximately 4% increase in available system speed.

There are several embodiments in the present invention. In one embodiment there is provided a compliant thermal interface which uses thermal paste between the chip device and the lid together with the use of a U-shaped channel as a variable height seal joint. In another embodiment of the present invention, a metal thermal interface material such as solder is employed, and the lid has a channel feature which provides a variable height seal joint. With the use of metal thermal interface material there is provided enhanced thermal conductivity. For example, solder has a thermal conductivity of approximately 30 watts per meter-Kelvin compared to a compliant thermal paste material which only has a thermal conductivity less than approximately 5 watts per meter-Kelvin. However, both of these embodiments provide a module with a hermetic or non-hermetic seal. For a hermetic seal it is possible to avoid use of a variable height seal joint if the tolerances of the thermal gap standoff features are small, because the solder can span the height tolerance gap between the substrate and the lid, as shown in a third embodiment.

FIG. 1 illustrates a preferred embodiment of the present invention employing a single chip module (SCM) where chip device 16 is connected to substrate 10 and lid 20 for environmental and handling protection. The embodiment in FIG. 1 in particular illustrates an SCM assembly process with manufacturing in the "chip-up" orientation 60. Heat sink 50 is attached to lid 20 with conductive adhesive 51 to further enhance module cooling. Typically, chip device 16 is secured by solder balls 14 and substrate pad 12 to substrate 10. Substrate 10 also typically includes one or more discrete devices 15 such as capacitors, resistors, etc. These devices are secured in the same way as chip device 16 via there own solder balls 14 and substrate pad 12. A device under film material 13 is applied to solder balls 14 or to device interconnects in order to enhance solder joint fatigue life because of coefficient of thermal expansion (CTE) mismatches of the materials during thermal cycling. Substrate interconnect (pins) 31 are used to directly attach to card assembly 30 or to a printed circuit board (PCB). For purposes of convenience, simplicity, and ease of understanding heat sink 50 and card assembly 30 are not specifically illustrated in FIGS. 2–5 nonetheless their inclusion therein is nonetheless readily apparent.

The invention shown in FIG. 1 illustrates a process for reducing and controlling thermal gap variation and tolerance in a sealed module. Thermal gap 18 is preferably controlled by incorporating standoffs 21 between chip device 16 and lid 20. Standoffs 21 are, for example, individual disks that are placed between chip device 16 and lid 20 during assembly or they may in fact be integral parts of lid 20. In fact, standoffs 21 are of any convenient shape. When standoffs 21 are employed, one achieves direct thermal gap control based only on invention intolerance of standoffs 21. In order to provide a seal around the module however, one employs U-shaped channel 40 which is affixed to substrate 10 with sealing material 41. This sealing material preferably comprises a material such as Sylguard which is commercially available. Compliant thermal interface material 17 is applied to the location on lid 20 where chip device 16 is to be disposed. Lid 20, with potentially integral standoffs 21, is then placed in position and the peripheral male edge sealing portion of lid 44 "floats" inside U-shaped channel 40 which contains a hermetic or non-hermetic sealant. For a solder sealant the assembly is sent through a furnace reflow process and solder 48 hermetically seals the module. This encapsulates the SCM which is either a hermetically sealed or non-hermetically sealed module.

Figure 2:
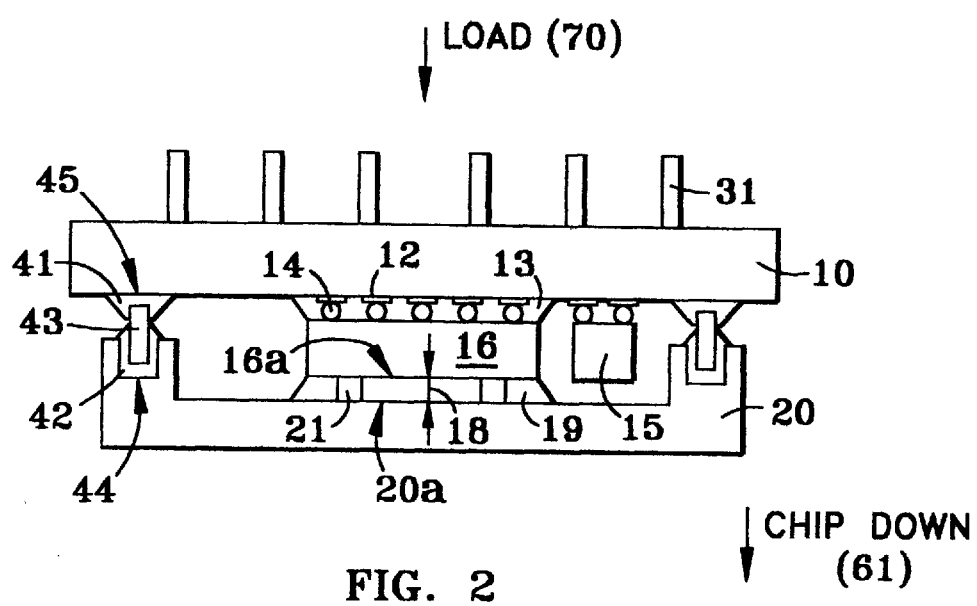
FIG. 2 is a cross-sectional side elevation view illustrating another embodiment of the present invention in which a U-shaped receiving channel is provided in the lid structure.

In a non-hermetic embodiment, the module is placed in a fixture which applies load 70 and the module is cured in a box type convection type oven or other heating/cooling apparatus. In a hermetic module, substrate seal area 45 in FIG. 2 is metallized for example using nickel or gold. U-shaped channel 40 is preferably made of Kovar and is gold plated and attached to substrate seal area 45 with a solder, for example, a gold tin solder. A lower temperature solder, for example a lead tin solder is placed in U-shaped channel 40 for later hermetic sealing. Lid seal area 44 is a preferably metallized with nickel or gold and the lid is placed in U-shaped channel 40 and soldered in place to form a hermetic seal. A fixture assembly applies load 70 to the module and the assembly is then heated in a furnace as part of a reflow process to hermetically seal the module. Higher melting point solders are employed to attach U-shaped channel 40 to substrate 10 and lower melting point solder is used for finally sealing the unit in order to reduce the complexity of having to develop a module seal on both solder interfaces (U-shaped channel 40 to substrate 10 and lid 20 to U-shaped channel 40).

FIG. 2 illustrates a particularly preferred embodiment of the present invention in which metal thermal interface material 19 is used between chip device 16 and lid 20. This is an alternative assembly process wherein the single chip module is processed in a chip down orientation 61 during manufacturing. The advantage of this method is better control of the metal thermal interface material 19 (solder) in which it is prevented from leaving the thermal interface gap 18 between chip device 16 and lid 20 during reflow joining. Chip device 16 is joined by solder balls 14 to substrate pads 12 on substrate 10. Additional discrete devices 15 may also be affixed using the same solder ball technology to substrate pads 12 and to substrate 10. The backside of chip device 16 is preferably metallized (16a) for example with nickel and gold for improved solderability.

For non-hermetically sealed modules seal ring 43 preferably comprises aluminum. Seal ring 43 is attached to substrate 10 by means of substrate sealing material 41 (see FIG. 2). Lid 20 has metallized area 20a with nickel and selective gold plating. This area has the same image size and location as chip device 16 and is provided for improved solderability. Lid 20 is affixed to substrate 10 under pressure and sent to a furnace reflow process so that the metal thermal interface material is adhered to lid 20 and chip device 16. Cap sealing material 42 is applied and the module is cured in a heat process to provide a non-hermetic seal.

For hermetically sealed modules, seal ring 43 preferably comprises a material such as Kovar and is plated with nickel and gold for better solderability. Seal ring 43 is attached to the substrate at the same time as chip device 16 and discrete devices 15. If there is a potential chip device rework process anticipated then one can join seal ring 43 after chip device 16 joining with a lower temperature solder than that applied to solder ball 14. Lid 20 includes metallized area 22*a* coated with nickel and selective gold plating in the same size and image location as chip device 16. Again this is employed for improved solderability. Seal area 44 is also metallized and tinned with solder for later module encapsulation. The assembly is placed in a pressure applying fixture and metal thermal interface material 19 (for example lid and solder) is simultaneously melted to join lid 20 to chip device 16 and to join seal ring 43 to lid seal area 44 during convection or an infrared belt furnace reflow operation.

An alternative to simultaneously attaching metal solder interface material and hermetically sealing module is to perform these steps individually. In such a case one uses a lower temperature solder to form the lid seal after lid 20 is attached to device 16.

Figure 3:
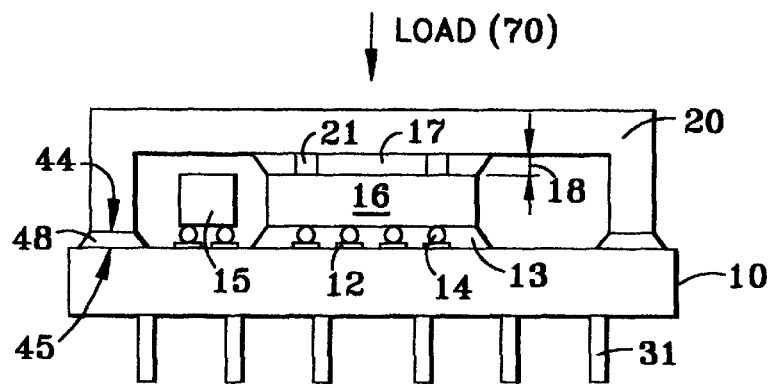
FIG. 3 is a cross-sectional side elevation view of an embodiment of the present invention which employs neither channels or male sealing rings but rather instead relies upon compliant sealant material.

FIG. 3 illustrates yet another preferred embodiment of the present invention employing a hermetically sealed single chip module wherein lid 20 is joined to substrate 10 without a seal ring and in which thermal gap size is controlled by means of standoffs 21. Chip device 16 is joined by solder balls 14 to substrate pads 12 on substrate 10. Additional discrete devices may also be employed and connected as described above. Cmpliant thermal interface material 17, that is, thermal paste, is applied in gap 18 on the area on lid 20 where chip device 16 is to be disposed. Lid 20 is then placed on chip device 16 and substrate 10 using a fixture which applies load 70 of approximately 2 pounds. The fixture assembly is then sent to a furnace reflow process and solder 48 hermetically seals the module.

To improve SCM thermal performance one places a metal thermal interface material inbetween lid 20 and chip device 16. In such case an area of lid 10 and chip device 16 are metallized with nickel and gold for better solderability. The solder, for example, lead tin solder, is tinned onto chip 16 and substrates area 45. Lid 20 is then placed on chip 16 and substrate 10 in a fixture applying a load of approximately 2 pounds. The assembly then undergoes a furnace reflow process and the solder hermetically seals the module.

In all of the above embodiments, a single chip module is used as an example. However, multi-chip modules (MCM) with more than one chip also benefit from the direct thermal gap control approach used herein to improve module thermal performance. In particular, one can even employ standoffs located on some or all of the chips to provide a controlled thermal gap for either hermetically or non-hermetically sealed multichip modules.

Figure 4:
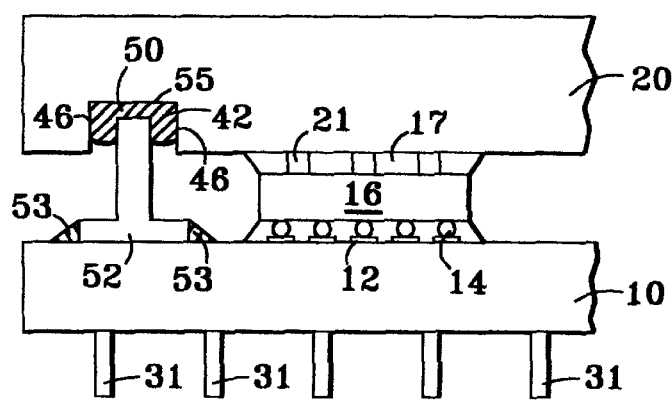
FIG. 4 is a cross-sectional side elevation view of an embodiment of the present invention in which a receiving channel structure is provided in the lid.
Figure 5:
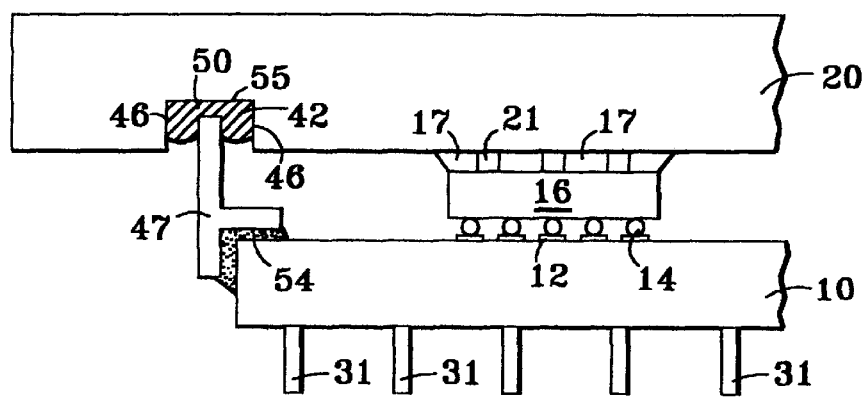
FIG. 5 is a cross-sectional side elevation view of an embodiment of the present invention similar to FIG. 4 except that the male sealing ring structure is disposed around the periphery of the substrate so as to provide for the possibility that the lid can extend beyond both the chip and beyond the substrate.

With specific reference being made to FIG. 4 it is seen therein that seal ring 52 having a T-shaped cross section is sealably affixed by means of sealant 53 to substrate 10. As shown, sealing ring 52 possesses an inverted "T" configuration which has a male portion which extends into sealant material 42 disposed within U-shaped channel 55 in lid 20. U-shaped channel 55 possesses sidewalls 46 and bottom 50. Likewise, in FIG. 5 a similar structure is shown except that sealing ring 47 is employed and while it likewise has a T-shaped cross-section it is oriented essentially with one arm of the T disposed in an upward orientation to extend into channel 50 in lid 20 which now is shown as having a greater horizontal extent than lid 20 in FIG. 4. In such instances lid 20 operates as a thermal spreader.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An electronic chip assembly in which control of thermal paste thickness is providable, said assembly comprising:

a substrate having electrical conductors thereon;

an electronic circuit chip affixed face down to said substrate so as to make electrical connection to said conductors;

thermal paste disposed on the non-face down side of said chip;

a thermally conductive lid disposed over said chip and having a substantially flat surface facing said chip and in thermal contact with said paste, said lid having a greater horizontal extent than both said chip and said substrate and therefore having an overhanging portion, said lid having a female channel disposed therein, said female channel having sidewalls and a bottom integral with said lid;

a male sealing ring sealably disposed continuously around a periphery of said substrate, said sealant material being disposed within said female channel between said sidewalls of said channel and a vertical male portion of said ring which extends at least partially into said channel.

2. The chip assembly of claim 1 which further includes at least one spacer structure disposed between said lid and the non-face down side of said chip.

3. The chip assembly of claim 2 in which said spacer structure is an integral part of said lid.

4. The chip assembly of claim 2 in which material for said spacer is selected from the group consisting of plastic, metal and ceramic.

5. The chip assembly of claim 2 in which said spacer structure comprises a plurality of discrete spacer elements.

6. The chip assembly of claim 2 in which said spacer structure is customized to said chip.

7. The chip assembly of claim 1 in which said channel extends in a path around said chip.

8. The chip assembly of claim 7 in which said path is closed.

9. The chip assembly of claim 1 in which said channel is a separate structure sealably affixed to said substrate.

10. The chip assembly of claim 1 further including a heat sink in thermal contact with said lid.

* * * * *